United States Patent
Takeda et al.

(10) Patent No.: US 6,806,099 B2
(45) Date of Patent: Oct. 19, 2004

(54) PROCESS FOR PRODUCING POLYCRYSTALLINE SILICON FILM BY CRYSTALLIZING ON AMORPHOUS SILICON FILM BY LIGHT IRRADIATION

(75) Inventors: Kazuo Takeda, Tokorozawa (JP); Masakazu Saito, Mobara (JP); Yukio Takasaki, Kawasaki (JP); Hironobu Abe, Chiba (JP); Makoto Ohkura, Fuchu (JP); Yoshinobu Kimura, Tokyo (JP); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/059,203

(22) Filed: Jan. 31, 2002

(65) Prior Publication Data

US 2003/0064571 A1 Apr. 3, 2003

(30) Foreign Application Priority Data

Oct. 2, 2001 (JP) ........................................ 2001-305927

(51) Int. Cl.⁷ ............................ G01R 31/26; H01L 21/66
(52) U.S. Cl. ............................ 438/7; 438/486; 438/16
(58) Field of Search ............................ 438/7, FOR 334, 438/488, 16, 486, 764; 257/E21.133, E21.134; 382/145, 149; 117/8, 10

(56) References Cited

U.S. PATENT DOCUMENTS

| | | | | | |
|---|---|---|---|---|---|
| 4,309,225 A | * | 1/1982 | Fan et al. | ...................... | 438/72 |
| 5,293,216 A | * | 3/1994 | Moslehi | ...................... | 356/600 |
| 5,432,122 A | * | 7/1995 | Chae | ...................... | 438/157 |
| 5,719,495 A | * | 2/1998 | Moslehi | ...................... | 324/158.1 |
| 6,015,720 A | * | 1/2000 | Minegishi et al. | ............ | 438/30 |
| 6,187,088 B1 | * | 2/2001 | Okumura | ...................... | 117/8 |
| 6,241,817 B1 | * | 6/2001 | Jang et al. | ...................... | 117/8 |
| 6,372,039 B1 | * | 4/2002 | Okumura et al. | ............... | 117/8 |

FOREIGN PATENT DOCUMENTS

| | | |
|---|---|---|
| JP | 10-214869 | 8/1998 |
| JP | 11-274078 | 10/1999 |
| JP | 2000-31229 | 1/2000 |

* cited by examiner

*Primary Examiner*—George Fourson
*Assistant Examiner*—Fernando L. Toledo
(74) *Attorney, Agent, or Firm*—Miles & Stockbridge P.C.

(57) ABSTRACT

The present invention provides a process for producing a polycrystal silicon film which comprises a step of forming a polycrystal silicon film by light irraditation of a silicon film set on a substrate, and a step of selecting substrate samples having an average grain size in a plane of the sample of 500 nm or more. According to the present invention, stable production of a high-performance poly-silicon TFT liquid crystal display becomes possible.

3 Claims, 19 Drawing Sheets

RELATIVE SCAN OF SAMPLE AND OPTICAL MEASUREMENT SYSTEM

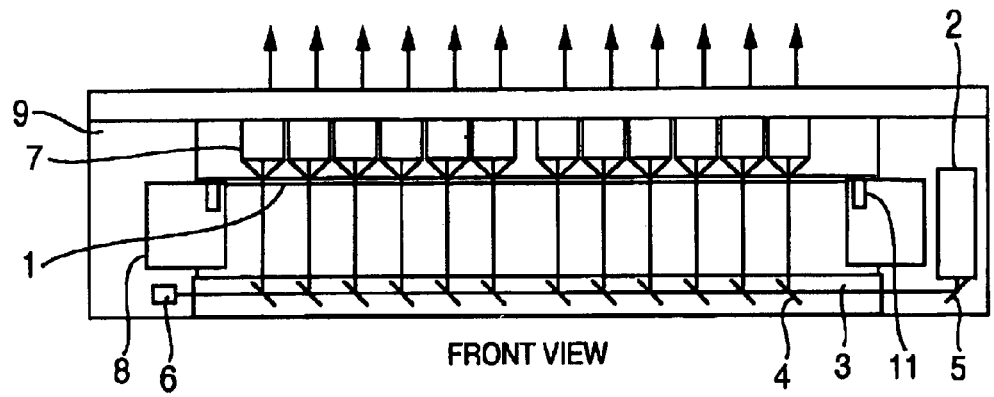
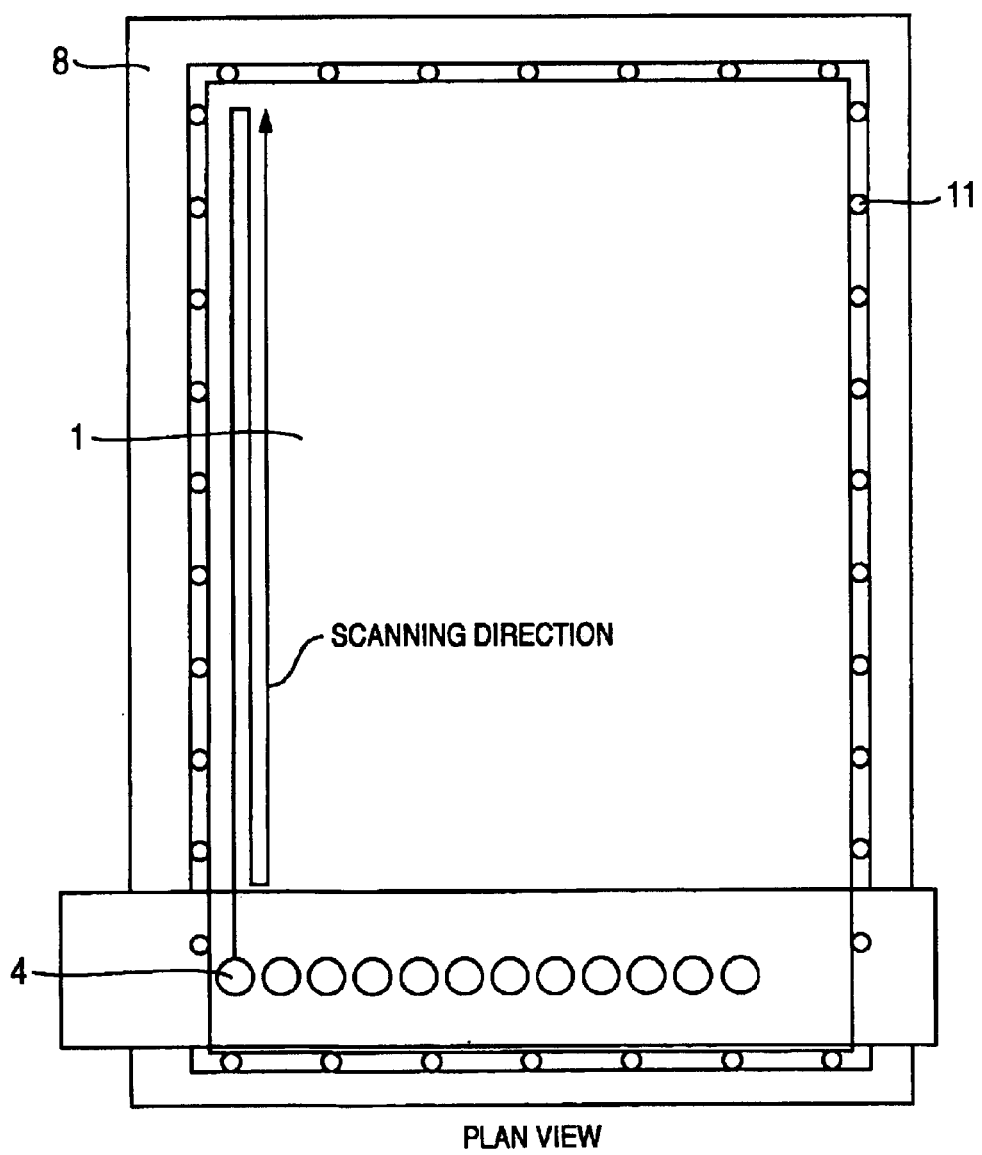

FRONT VIEW

PLAN VIEW

FIG.6
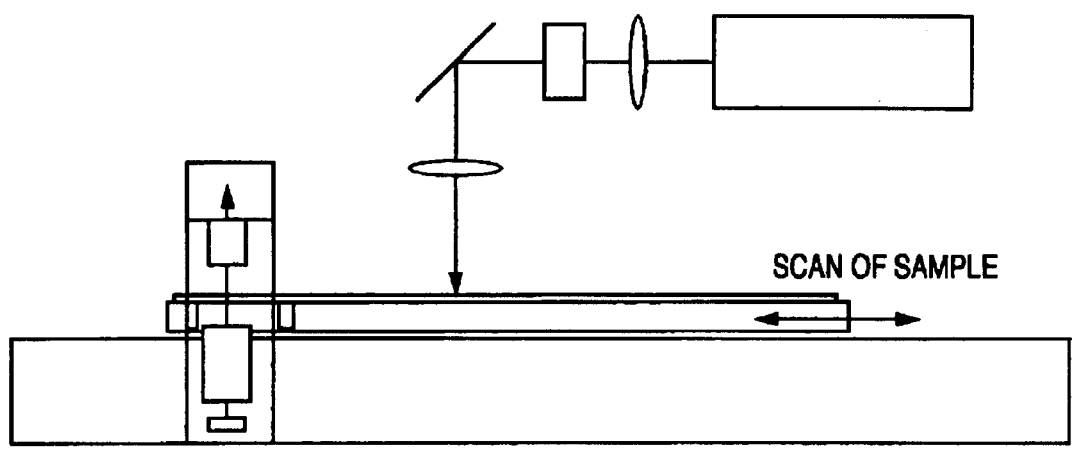
SCAN OF SAMPLE
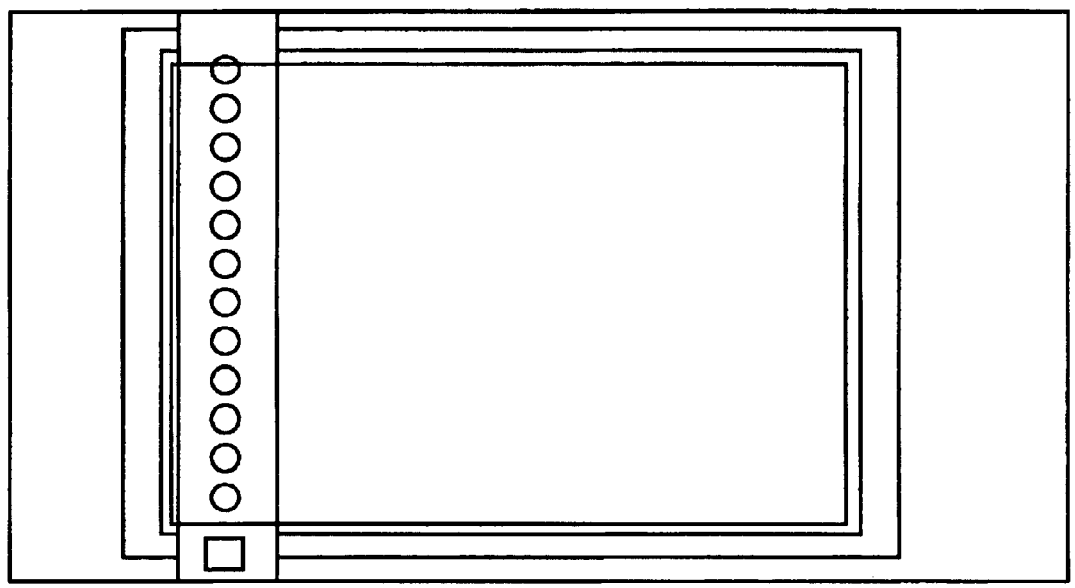
PLAN VIEW

LIGHT SCATTERING WITHOUT INTERFERENCE EFFECT BETWEEN PARTICLES RELATIVE SCATTERED LIGHT INTENSITIES

BAND WIDTH : DISTRIBUTION A > DISTRIBUTION B
PARTICLE SIZE : DISTRIBUTION A < DISTRIBUTION B

LIGHT SCATTERING WITH INTERFERENCE EFFECT BETWEEN PARTICLES

BAND WIDTH : DISTRIBUTION A > DISTRIBUTION B
PARTICLE SIZE : DISTRIBUTION A < DISTRIBUTION B

FIG.8

| LASER FLUENCE | 420 mJ/cm² | 440 | 470 | 490 | 510 |
|---|---|---|---|---|---|
| SCATTERED LIGHT INTENSITIES VS SCATTERING ANGLES | SCATTERING ANGLE (with θp marked) | SCATTERING ANGLE | SCATTERING ANGLE BANDWIDTH: MINIMUM θp: MINIMUM | SCATTERING ANGLE | SCATTERING ANGLE |
| SEM OBSERVATION (GRAIN SIZE) | SIMILARLY SIZED CRYSTAL GRAIN<br>SIZE = 300nm<br>WITHOUT FUSION | MIXTURE OF FUSED CRYSTAL GRAINS AND NON FUSED CRYSTAL GRAINS<br>>300nm<br>GRAIN SIZE INCREASE BY FUSION. | ALL FUSED CRYSTAL GRAINS<br>>500nm<br>MAX SIZE | MIXTURE OF FUSED CRYSTAL GRAINS AND MICRO CRYSTAL GRAINS<br>>300, 60-300nm<br>MEAN GRAIN SIZE DECREASE BY GENERATION OF MICRO CRYSTAL GRAINS | MICRO CRYSTAL GRAIN REGION<br>60-100nm |
| AFM MEASUREMENT (ROUGHNESS) | PV=85nm<br>RMS>8nm<br>MAXIMUM ROUGHNESS | PV=80~50nm<br>RMS=8~6nm<br>ROUGHNESS DECREASE BY FUSION | PV<50nm<br>RMS<6nm<br>MINIMUM ROUGHNESS | PV<50nm<br>RMS<7nm | PV<50nm<br>RMS<7nm |

SIMILARY SIZED
CRYSTAL GRAIN REGION
(WITHOU FUSION)

600nm

420mJ/cm²

FUSED CRYSTAL GRAIN REGION

600nm

480mJ/cm²

MICRO CRYSTAL GRAIN REGION

600nm

510mJ/cm²

THE REGION HAVING MICRO
CRYSTAL GRAINS

→ SCANNING OF SAMPLE

PROCESS FOR PRODUCING POLYCRYSTALLINE SILICON FILM BY CRYSTALLIZING ON AMORPHOUS SILICON FILM BY LIGHT IRRADIATION

BACKGROUND OF THE INVENTION

The present invention relates to a process for producing a poly-silicon (hereinafter abbreviated as poly-Si) film for liquid crystals and semiconductor devices, and a method for inspecting the poly-silicon film.

The reason why a poly-silicon film is superior to an amorphous silicon (a-Si) film as the active layer of a thin film transistor (TFT) used as a driver element in a liquid crystal display is as follows: in the case of the poly-silicon film, since the mobility of a carrier (electrons in n channel or holes in p channel) is high, the cell size can be reduced, so that the precision and minuteness of the liquid crystal display can be enhanced. In addition, the formation of a conventional poly-Si TFT requires a high-temperature process at 1,000° C. or higher. On the other hand, a TFT having a high carrier mobility can be formed in a low-temperature process permitting employment of an inexpensive glass substrate, when there is adopted a low-temperature poly-silicon formation technique in which annealing of only a silicon layer with a laser does not make the temperature of the substrate high.

In this laser annealing, as shown in FIG. 13, an a-Si film formed on a glass substrate is scanned while being irradiated with light absorbable thereby, to make the whole a-Si film into a polycrystal, whereby a poly-Si film is obtained. As shown in FIG. 14, the poly-Si grain size varies with the surface density of irradiation energy (fluence) of a laser, so that the stability of the laser reflects on the grain size distribution of the poly-Si. The carrier mobility of the poly-Si film increases with an increase of the grain size. In order to attain high TFT characteristics with in-plane uniformity, it is necessary to make the grain size distribution uniform and maintain a large grain size. To attain the large grain size, employment of a fluence in the D region shown in FIG. 14 is sufficient. However, if the fluence shifts upward owing to the instability of the laser, or the like, the fluence enters a region shown as the E region in FIG. 14, i.e., a region where the poly-Si film contains micro crystals with a grain size of 200 nm or less. In this case, the carrier mobility is decreased, resulting in a faulty device. The grain size varies not only with the laser fluence but also with the nonuniformity of thickness of the a-Si film before the laser annealing. Therefore, in order to form the poly-Si film so that its grain size may always be in a definite range, the laser instability and the thickness change of the substrate have to be kept slight. For this purpose, control of the grain size is necessary. Accordingly, it becomes important to control the poly-Si grain size to keep it constant, by checking the poly-Si grain size and feeding back the check result to the laser annealing conditions.

As a method for the control, measuring the grain size itself of the poly-Si is the most reliable. The grain size has been measured by incorporating a sample for the check into an initial or intermediate production lot, or by randomly sampling a product and directly observing the grain size of a poly-Si film formed in a production process, by an electron microscope or a scanning tunnel microscope. As other prior arts, there are the following methods. Japanese Patent Kokai No. 10-214869 discloses a method in which a poly-silicon film is evaluated on the basis of its transmittance. According to this method, the grain size cannot be estimated, though insufficient crystallization due to the insufficient fluence of laser beams can be monitored on the basis of the ratio between a-Si and a poly-Si by utilizing the difference in absorption coefficient between a-Si and the poly-Si. Japanese Patent Kokai No. 11-274078 discloses a method in which a poly-silicon film is evaluated on the basis of its surface gloss (reflectance). In this method, the change of the gloss with the poly-Si grain size is utilized and the gloss is considered to be minimal at an optimum poly-Si grain size. This optimum poly-Si grain size corresponds to a grain size at which the reflectance becomes minimal, namely, the surface roughness becomes maximal.

SUMMARY OF THE INVENTION

The pressure resistance of the gate insulating film of a device becomes insufficient if the surface roughness of the film is high. Thus, a grain size detected by the utilization of conditions under which the surface roughness becomes maximal is used in a method in which there is detected a region where the risk of insufficient pressure resistance due to a remarkable surface unevenness is the highest. If this region is employed, a process for reducing the surface roughness is required, resulting in a complicated production process. Thus, a device production process dependent on the above-mentioned prior art substrate examination methods requires a special process for reducing the surface roughness, and its adoption is limited to that at a grain size (about 300 nm) in the B region shown in FIG. 14. However, a poly-Si film having a higher carrier mobility has to be formed in order to produce a liquid crystal which consumes less electricity and has higher precision and minuteness. To form such a poli-Si film, it is sufficient that there is employed the D region shown in FIG. 14, i.e., a region in which the grain size becomes maximal. For this purpose, it is necessary to estimate the grain size, independent of the surface roughness. As a method for determining the D region, the above prior arts are not suitable and examination by electron-microscopic observation is not suitable for determination on the site of a mass production line because it requires human labor and a long time for obtaining a measurement result. Accordingly, it is difficult to produce stably a poly-Si substrate having a low surface roughness and a grain size of more than 300 nm. The present invention was made in view of the above problems, and makes it possible to determine a region where the surface roughness is low and the grain size of a poly-Si is maximal, by a simple method. Thus, the present invention is intended to provide a process for producing a poly-Si film having a low surface roughness and a high carrier mobility, without product nonuniformity or in high yield.

For the achievement of the above object, the present invention provides a process for producing a poly-Si film which comprises a step of forming a poly-Si film by annealing a silicon film set on a substrate, by light irradiation, a step of measuring a light diffraction pattern of the poly-Si film, and a step of selecting the poly-Si film on the basis of the light diffraction pattern.

The aforesaid silicon film is composed of an a-Si film and is converted to a poly-Si film by annealing by laser beam irradiation. The grain size of the poly-Si film is estimated by measuring the angular distribution of scattered light intensities, and the quality of the poly-Si film is judged by knowing whether its grain size is in the range of the upper limit of the average grain size to the lower limit which range is defined by the relationship between the field-effect mobility and the grain size.

As shown in FIG. 1, a light source 2 used for the above-mentioned poly-silicon size measurement with angle dependency of scattered light intensity is a laser having an output wavelength of 540 nm or less and emits laser beams perpendicularly to a substrate 1 having the above-mentioned poly-Si film formed thereon. A plurality of light detector units 7 are located at their respective angles in a range of about 5° to about 45° in order to measure the angular distribution of the intensities of scattered lights from the irradiation region. As shown in FIG. 7, the relationship between the poly-Si grain size and the breadth of angular distribution of scattered light intensities in the light diffraction pattern of the poly-Si film is explainable in terms of a relation based on Fourier transformation which is such that in general, the breadth of angular distribution of the intensities of scattered light from particles decreases with an increase of the particle size. FIG. 7 shows both the case of single particles not interfering with one another and the case of densely aggregated particles interfering with one another. In the latter case, the distribution is such that the scattered light intensity decays at a scattering angle close to zero. In either case, when distribution A with a larger breadth of angular distribution and distribution B with a smaller breadth of angular distribution are compared for the grain size, the grain size in the case of distribution B can be judged to be larger than in the case of distribution A. According to this principle, the grain size is measured without destruction.

In the above process for producing a poly-Si film, there is measured the breadth of angular distribution of scattered light intensities in a light diffraction pattern of a poly-Si formed as a thin film by irradiating a-Si with exciter laser beams, in the production procedure of a poly-Si. From the measurement result, the grain size of the poly-Si is estimated. On the basis of the estimation result, the fluence of anneal laser beams is set. When the fluence of anneal laser beams is too low, the grain size does not become sufficiently large. Therefore, the lower limit of the fluence is fixed.

On the other hand, in a region where micro crystals are formed as shown in FIG. 17 because of too high a fluence, the average grain size is decreased and a linear pattern appears in a light diffraction pattern as shown in FIG. 18. Micro-crystal streak lines are detected by detecting the linear pattern. The upper limit of the fluence of anneal laser beams is fixed so that the micro crystal streak lines may not appear. The lower limit and upper limit of the laser fluence are fixed as follow in the range of control of the average grain size.

The range of control of the average grain size (the upper limit and lower limit of the average grain size) is determined from a desirable field effect mobility and the range of variation of in-plane distribution of field effect mobility by utilizing the relationship between the average grain size and the field effect mobility shown in FIG. 15.

In order to determine the laser annealing conditions before the production, annealing is conducted under laser fluence conditions stepwise varied in a substrate, after which the average grain size is estimated from the breadth of angular distribution in a light diffraction pattern of the resulting poly-silicon film, and the laser annealing conditions are determined so that the average grain size may be in the range of control. In an actual process, the reduction of the product nonuniformity and the improvement of the yield are carried out by estimating the in-plane distribution of the grain size of a poly-Si film after laser annealing, judging the quality of the substrate sample obtained by the laser annealing, according to the above-mentioned criterion, and sending the sample to a subsequent step only when it is judged good. In this case, a total inspection need not always be carried out, and either a sampling inspection or a total inspection may be chosen depending on the range of variation of the average grain size of each substrate sample in one and the same lot. That is, when the range of variation of the average grain size of each substrate sample in one and the same lot is in a range of ±20%, inspection of at least one substrate sample in one and the same lot is sufficient. In a conventional sampling inspection, three samples, i.e., the first sample, an intermediate sample and the last sample in each lot are inspected. When the range of in-plane variation of the average grain size is in a range of ±20% for all of the three samples, the whole lot is considered as a good lot. However, if the range of variation of the average grain size of even only one of the three substrate samples is outside the range of ±20%, the sampling inspection for the lot is switched over to a total inspection.

Thus, substrate samples are screened by the total inspection or the sampling inspection. According to the data shown in FIG. 15, by controlling the grain size so that the average grain size may be 500 nm or more and that the range of variation of the average grain size in the in-plane distribution of average grain size values may be in a range of ±20%, there is formed a poly-silicon film having a field effect mobility not less than a set value 200 $cm^2/VS$ and an in-plane variation of field effect mobility in a range of ±10%.

BRIEF DESCRIPTION OF DRAWINGS

FIG. 2A and FIG. 2B are diagrams showing a structure of equipment (a multi-beam type) for grain size measurement and check based on a light diffraction pattern.

FIG. 6 is a diagram showing the structure of a laser annealing equipment incorporated with a grain-size-measuring function based on a light diffraction pattern.

FIG. 8 shows a table summarizing experimental data obtained by investigating the relationships among a light diffraction pattern of each poly-silicon, its grain size and its roughness.

DESCRIPTION OF REFERENCE NUMERALS

1—substrate sample obtained by forming a poly-silicon film on a glass substrate, 2—source of irradiation laser beams, 3—irradiation laser beam, 4—half mirror, 5—mirror, 6—irradiation light intensity monitor, 7—detection surface for light diffraction pattern, 8—substrate-supporting pedestal, 9—frame for fixing optical irradiation system and optical detection system, 10—scattered light, 11—vacuum chuck hole for substrate fixation, 11-1—detector unit, 11-2—aperture, 12-1—two-dimension detector, 12-2—lens, 12-3—poly-Si film on glass, 13-1—line beam pulse excimer laser, 13-2—mirror, 13-3—poly-Si film, 17-1—direction of long axis of irradiation beam of anneal laser, 18-1—diffraction pattern from boundary between micro crystal grain region and fused crystal grain region, 18-2—ring-shaped light diffraction pattern reflecting mean grain size.

DETAILED DESCRIPTION OF THE INVENTION

As a results of experiments by the present inventor, the following was found: when the grain size of the poly-silicon formed is maximal and the polysilicon contains no micro crystal, the electric conductivity is high and the breadth of angular distribution of the intensities of scattered light from the thin film formed by excimer laser annealing (ELA) is minimal.

The experimental data are shown in the table in FIG. B. The data indicate the angle dependency of the intensity of scattered light from the poly-Si film and the laser fluence dependency of SEM observation results and AFM observation results. As a result of the SEM observation, the following was found: when the fluence is 420 mJ/cm$^2$, there is obtained a similarly sized crystal grain region where the grain size is about 300 nm; according as the fluence is increased, there are obtained crystals each formed by fusion of a plurality of grains having a grain size of about 300 nm; and with the progress of the fusion, the average grain size is increased. At a fluence close to 470 mJ/cm$^2$, the fusion rate in the poly-Si grain boundaries is maximal, resulting in a maximum average grain size. In the case of a poly-silicon having a uniform grain size, a projection is present at the triple point of boundaries. A fused crystal is a crystal formed by fusion of a plurality of uniform grains and has a shape having projections in grain boundaries owing to the fusion. According to the AFM observation, the maximum height difference (PV), an indication of roughness is 60 nm or more in the case of a uniform grain size, and is decreased to less than 60 nm with the progress of fusion. The root mean square roughness (RMS) is more than 8 nm in the case of a uniform grain size, and is decreased to less than 8 nm with the progress of fusion. These results agree with the relationship between grain size and roughness shown in FIG. 14.

Figure 1:
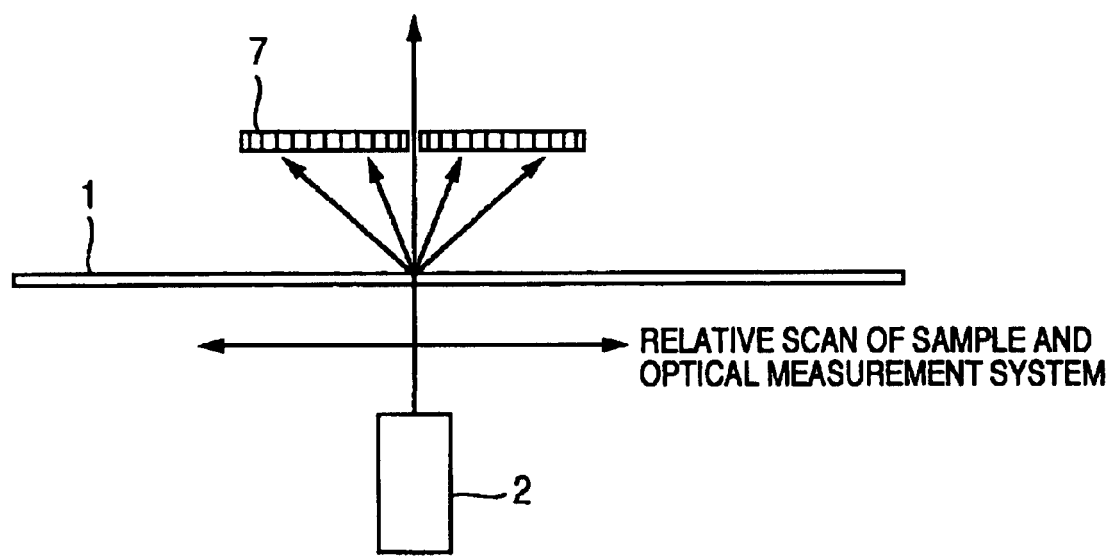
FIG. 1 is a diagram showing an example of structure for explaining a method for estimating the grain size of a poly-silicon according to the present invention.
Figure 9:
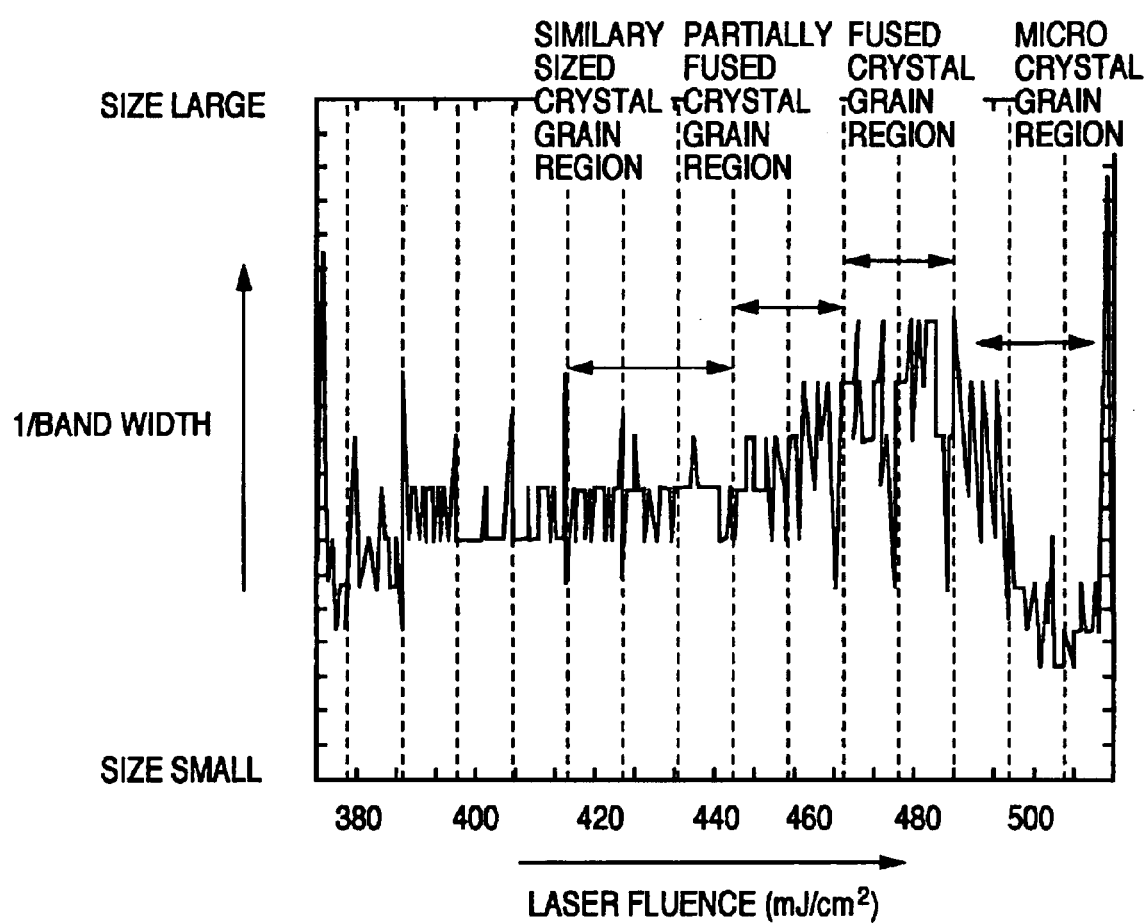
FIG. 9 is a graph obtained by investigating the laser fluence dependence of the breadth of angular distribution of scattered light intensities in a light diffraction pattern.
Figure 10A:
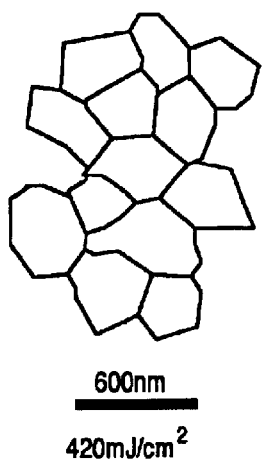
FIG. 10A, FIG. 10B and FIG. 10C are diagrams showing poly-silicon grain boundaries observed in one and the same sample by SEM.
Figure 10B:
Figure 10C:
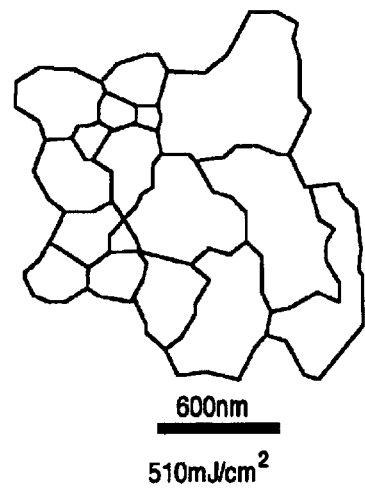

FIG. 9 is a graph showing the fluence dependency of the reciprocal of the breadth of angular distribution in a light diffraction pattern measured by the use of the measurement system shown in FIG. 1. It can be seen that as shown in FIG. 9, the breadth of angular distribution decreases (namely, 1/the breadth of angular distribution increases) with an increase of the fluence, and it increases (namely, 1/the breadth of angular distribution decreases) when the fluence exceeds about 490 mJ/cm$^2$ or more. FIG. 10 shows the grain boundaries in SEM photographs of the same samples as in the case of FIG. 9. A sample obtained at a fluence of 420 mJ/cm$^2$ has a grain size of about 300 nm which is in a similarly sized crystal grain region. A sample obtained at a fluence of 480 mJ/cm$^2$ has an average grain size of 500 nm or more owing to fusion. A sample obtained at a fluence of 510 mJ/cm$^2$ shows the presence therein of micro crystals together with crystals with a large grain size formed by fusion. Therefore, the graph shown in FIG. 9 indicates that the breadth of angular distribution decreases with an increase of the poly-Si grain size. In addition, this graph corresponds to the graph shown in FIG. 14 and showing the fluence dependence of the grain size, and indicates that it is possible to detect a D region where the roughness is low and the grain sized is maximal. In the present invention, optimum conditions for the laser annealing are determined by utilizing the following fact: a state capable of minimizing the breadth of angular distribution of scattered light intensities is a condition under which the grain size becomes maximal and no micro crystal is present together with crystals with a large grain size, and hence the state gives the highest field effect mobility. Furthermore, on the basis of the result of measurement of the grain size, rejects are discriminated and prevented from flowing into the subsequent step for the production, or the measurement result is fed back to a set value of the fluence for the laser annealing. Thus, a poly-Si film is always produced under the optimum conditions, whereby the yield is increased.

Figure 14:
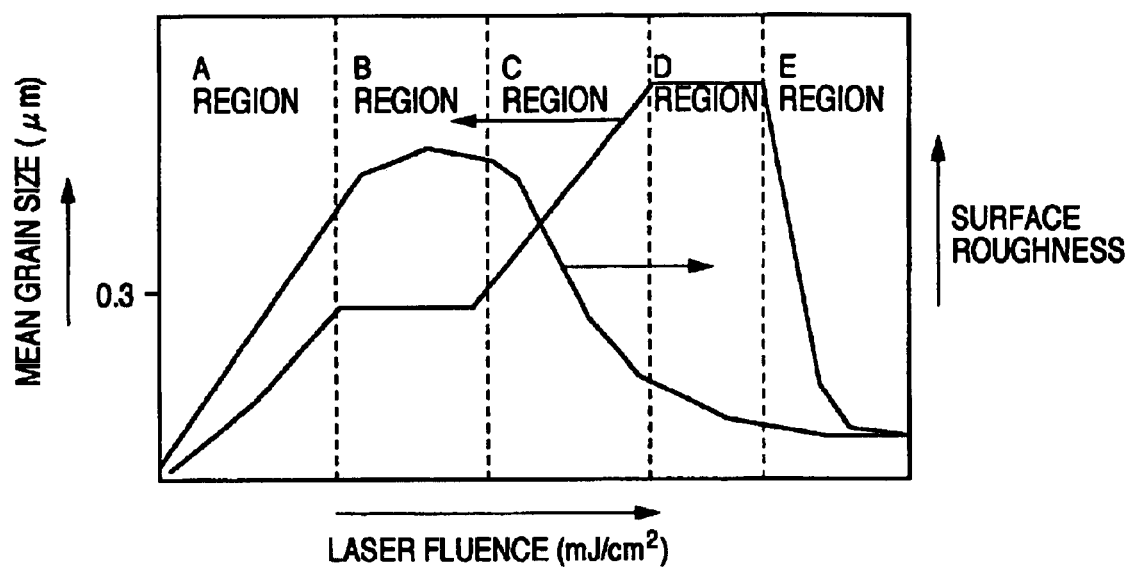
FIG. 14 is a graph showing the relationships among laser fluence, poly-Si grain size and surface roughness.
Figure 16:
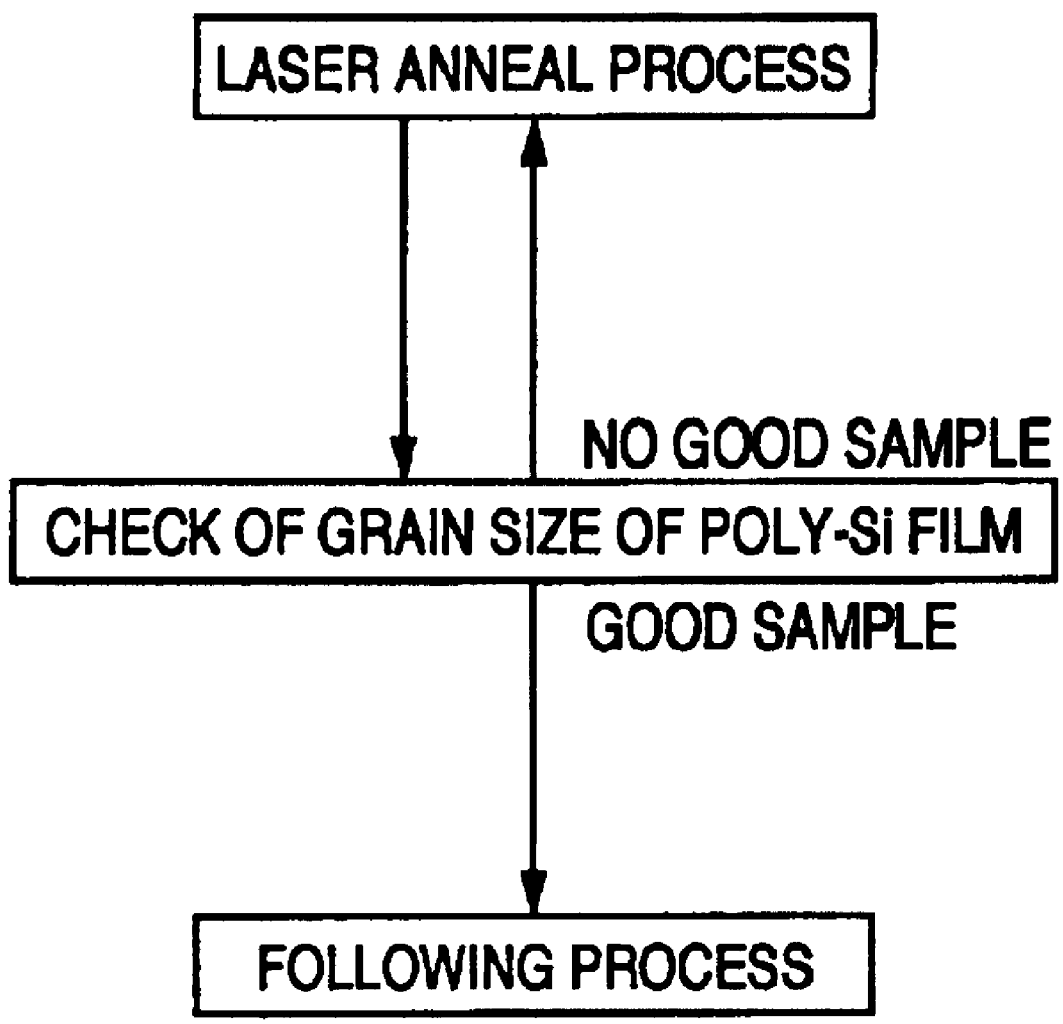
FIG. 16 is a chart showing a method for feed-back to a laser annealing process on the basis of information on a grain size check.

FIG. 16 illustrates the above steps of procedure schematically. Information obtained by checking the grain size is sent to a central-control computer and fed therefrom back to the production process as, for example, information on the flow of a substrate sample for a carrier robot and information on the change of process parameters for a production equipment. The carrier robot carries the substrate sample from a laser annealing equipment to a grain size measurement equipment or from the latter to the former, and the robot and the equipments communicate with one another by means of a network. A poly-Si substrate sample produced by the laser annealing equipment is carried to the grain size measurement equipment by the carrier robot and evaluated. To the central-control computer and the laser annealing equipment, the grain size measurement equipment gives information on the result of judging the quality of each substrate sample according to a definite criterion and the grain size in-plane distribution of a substrate sample judged no good. A substrate sample judged good is carried to the production equipment used in the subsequent step. The substrate sample judged no good is returned to the laser annealing equipment for the purpose of re-annealing. In the grain size measurement equipment, the following is carried out besides the judgment of the quality: for the substrate sample judged no good because of its small grain size, the side on which the conversion to micro crystals has took place is judged to be either a high-fluence side or a low-fluence side, whereby conditions for the laser re-annealing are determined. As to a method for judging that micro crystals have been formed on the high-fluence side, this judgment is made when the C region shown in FIG. 14 is present in a part of the grain size in-plane distribution in a definite proportion or more and a micro crystal grain region is present together therewith. As to a method for judging that micro crystals have been formed on the low-fluence side, this judgment is made when the B region shown in FIG. 14 is present in a part of the grain size in-plane distribution in a definite proportion or more and a micro crystal grain region is present together therewith.

A method for determining the laser re-annealing conditions is described below in detail. As to the laser re-annealing conditions for a substrate sample whose micro crystals have been judged to be those formed on the high-fluence side, the re-annealing is carried out at a fluence lower than the initial laser fluence. As to the laser re-annealing conditions for a substrate sample whose micro crystals have been judged to be those formed on the low-fluence side, the re-annealing is carried out at a fluence higher than the initial laser fluence. As a method for the re-annealing, there are two methods, i.e., a method of re-annealing an area where the micro crystals are present, and a method of re-annealing the whole substrate sample surface. In the case of a substrate sample in which micro crystals are present together with grains having grain sizes in the B region and the C region, only an area where the micro crystals are present is re-annealed, or the idea of re-annealing is given up and the substrate sample is judged to be one which has to be discarded. Conditions for the re-annealing in this case are as follows. When the grain size range of grains near the micro crystals is in the B region, a fluence higher than the initial fluence is employed. When the grain size range of grains near the micro crystals is in the C region, a fluence lower than the initial fluence is employed.

Figure 15:
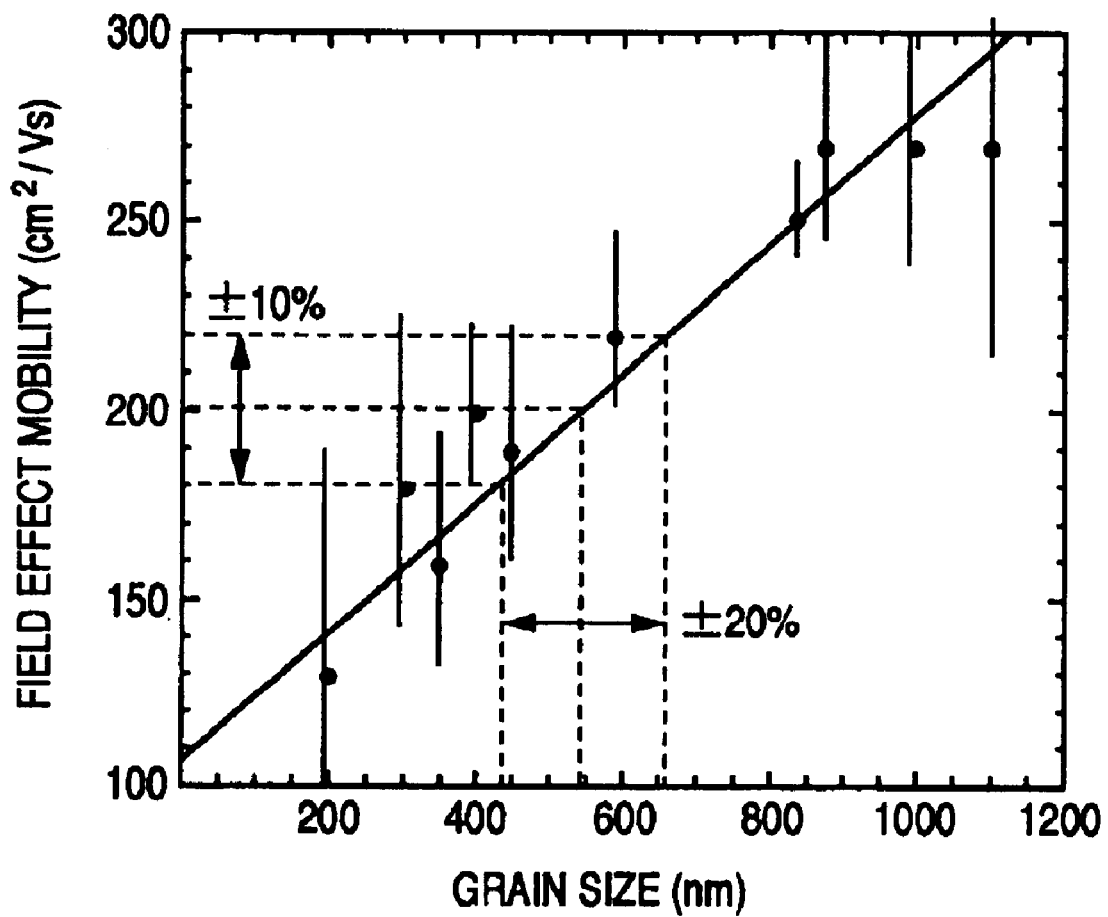
FIG. 15 is a graph showing the relationship between poly-Si grain size and carrier mobility.

FIG. 15 is a graph obtained by investigating the relationship between field effect mobility measured in a poly-Si TFT and the grain size of the poly-Si. A region where the field effect mobility becomes a uniform value, i.e., about 250±15 $cm^2/VS$ is present near a grain size of 800 nm. The relationship between the field effect mobility and the variation of the grain size is determined from the slope of the straight line shown in FIG. 15, to find that the variation of the average grain size has to be in a range of ±20% in order to keep the variation of the field effect mobility in a range of ±10%. The result of estimating the grain size is fed back to the process so as to control the grain size. By the feedback, a poly-Si TFT having a field effect mobility in a range of 250±15 $cm^2/VS$ can be produced. In this case, the in-plane variation of the mobility is in a range of ±10%.

A mode for practicing a grain size measuring method is described below.

Figure 11:
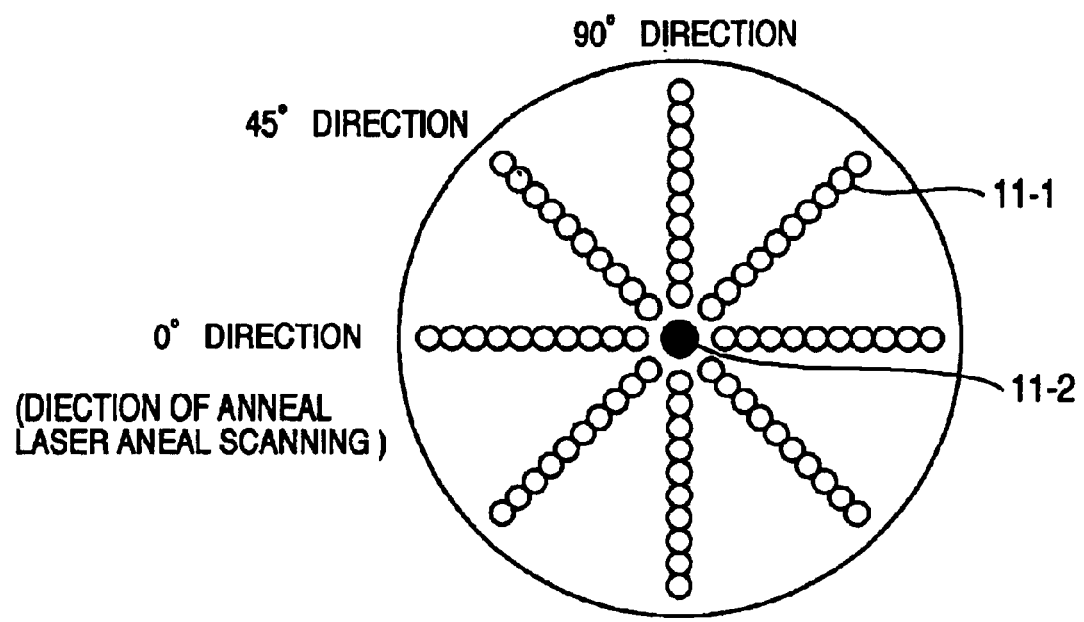
FIG. 11 is a diagram showing the array of detector units for measuring a light diffraction pattern.
Figure 12:
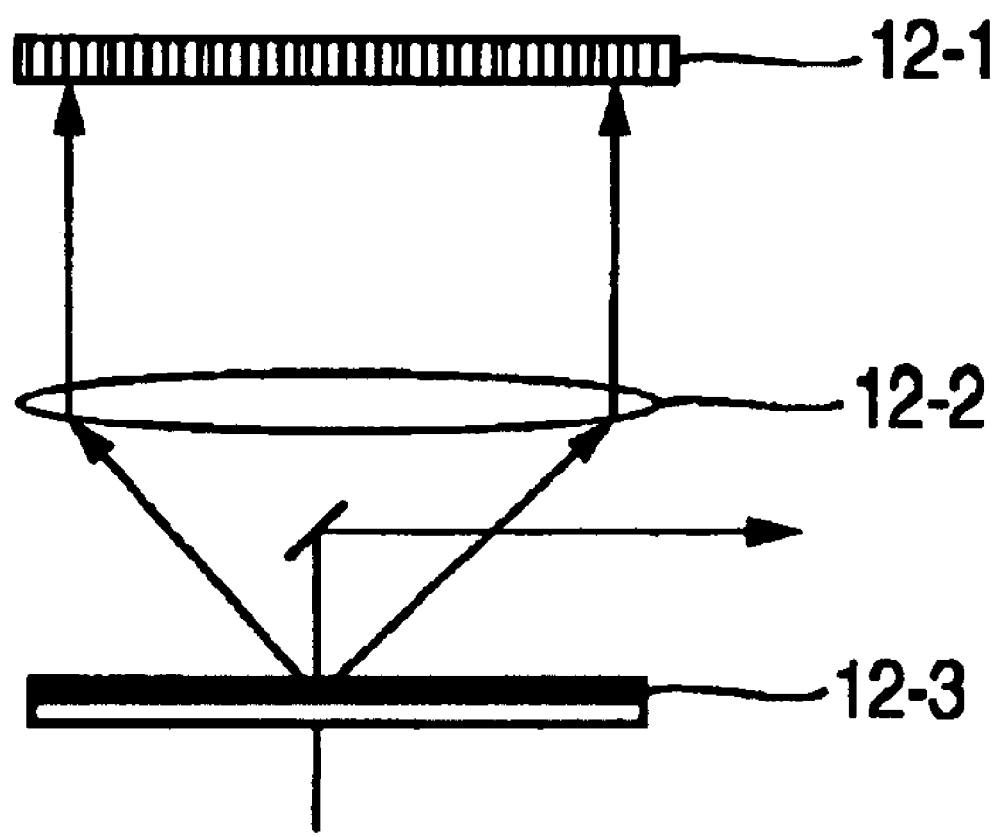
FIG. 12 is a diagram showing an optical detection system in the case where a detector for measuring a light diffraction pattern is of a two-dimensional detection type.

FIG. 1 is a diagram showing a method for measuring the grain size of a poly-Si according to one embodiment of the present invention. First, a sample 1 is prepared by irradiating an a-Si film constituting the uppermost layer of a laminate obtained by laminating at least one thin film on a glass substrate by a plasma CVD method, with excimer laser beams with a wavelength of about 300 nm to convert the a-Si film to a polycrystal. This sample is irradiated with light from a laser beam source 2 with an output wavelength of 532 nm perpendicularly to the sample surface from the side reverse to the side on which a poly-Si film has been formed. The intensities of scattered light from the poly-Si film are measured with a plurality of light detector units 7 located at their respective angles on the side on which the poly-Si film has been formed. The angle range for the measurement is a range of 5° to 45°. According to a relation based on Fourier transformation, the relationship between the particle size of a light-scattering substance and the breadth of angular distribution of scattered light intensities is as follows: with an increase of the particle size, the angular distribution of scattered light intensities becomes that at lower angles, namely, the breadth of angular distribution of scattered light intensities is decreased; and with a decrease of the particle size, the breadth of angular distribution is increased. By utilizing the principle described above, the grain size of the poly-Si film is estimated by measuring the breadth of angular distribution of scattered light intensities. The grain size is determined by using a calibration curve showing the relationship between the grain size and the breadth of angular distribution which has previously been obtained. As a method for measuring the breadth of angular distribution, there is a method of measuring the breadth by setting a plurality of detector units at their respective angles in one-dimensional array on a diffraction surface as shown in FIG. 11, and a method of measuring a light diffraction pattern with a two-dimension light detector as shown in FIG. 12. In both methods, irradiation beams have to be prevented from entering the detector directly.

Figure 3:
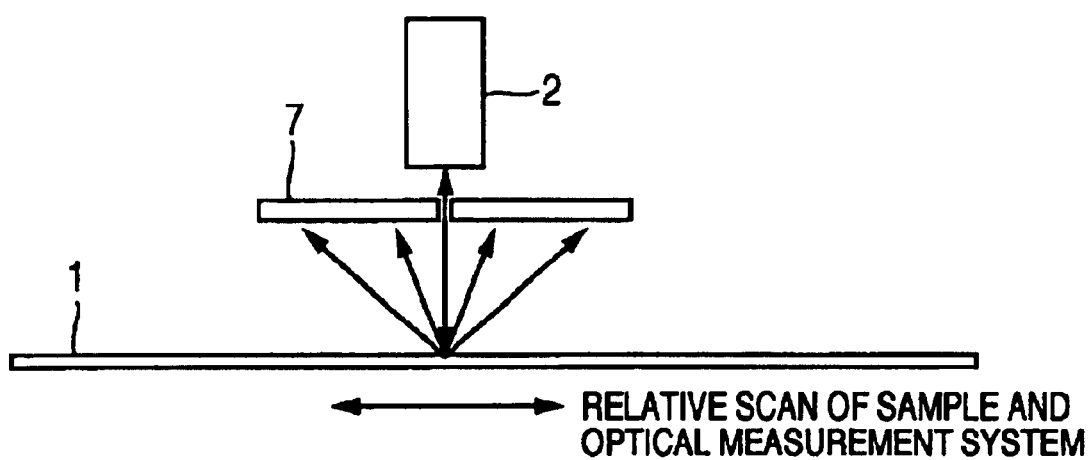
FIG. 3 is a diagram showing another example of structure for explaining a method for estimating the grain size of a poly-silicon according to the present invention.
Figure 4A:
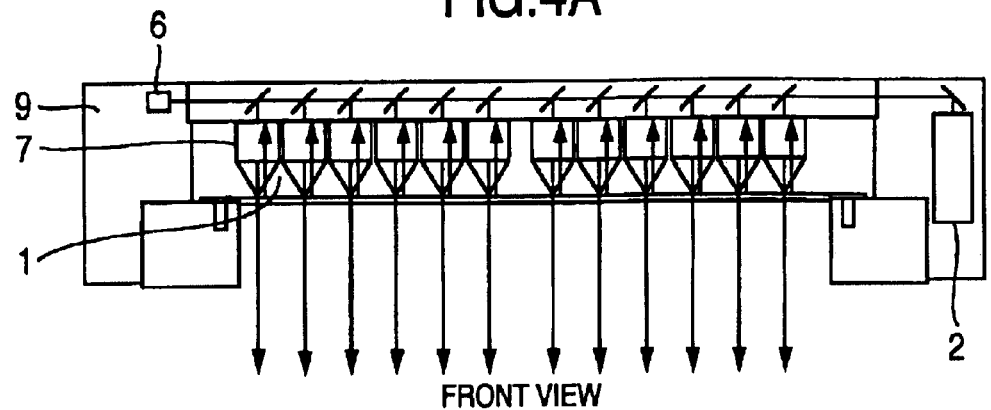
FIG. 4A and FIG. 4B are diagrams showing another structure of equipment (a multi-beam type) for grain size measurement and check based on a light diffraction pattern.
Figure 4B:
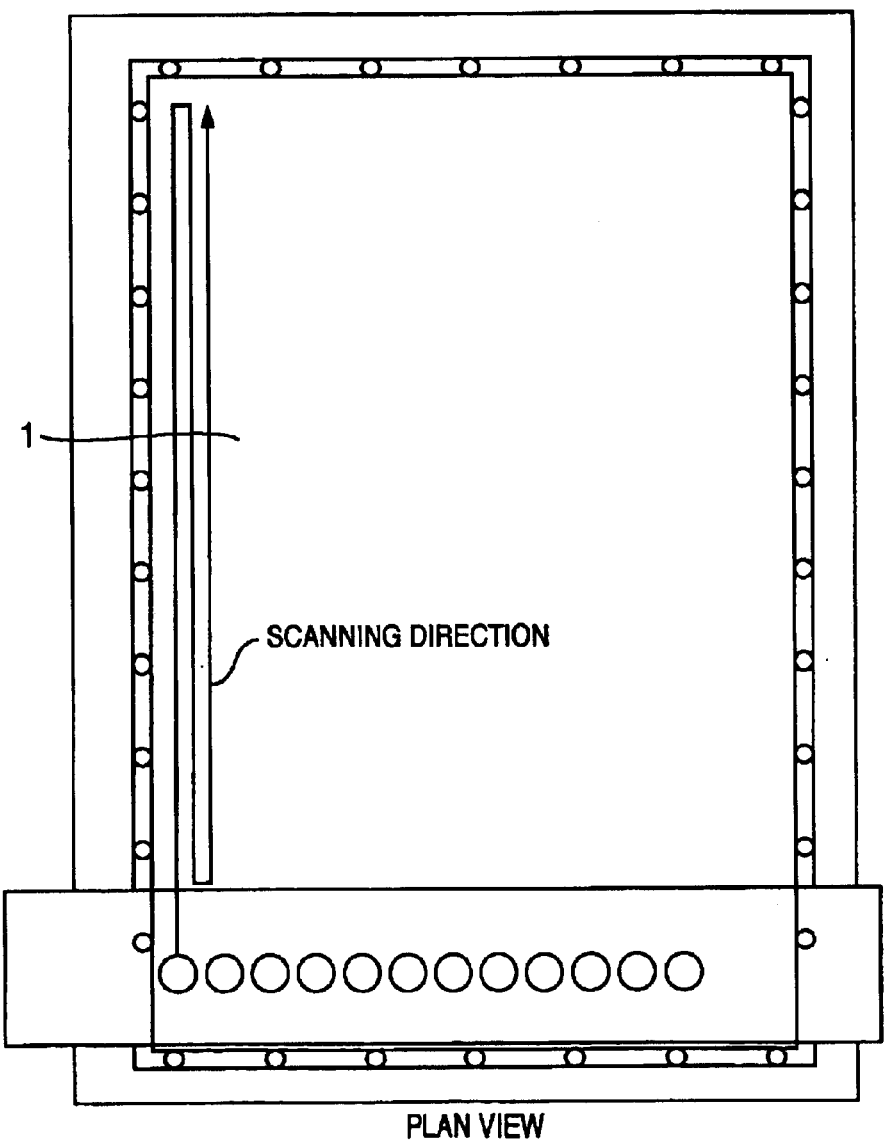
Figure 5:
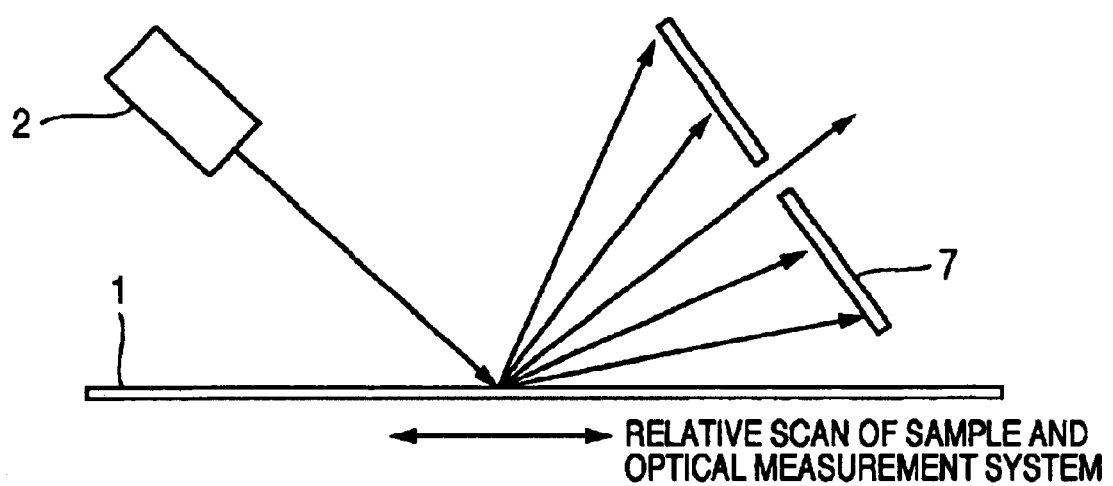
FIG. 5 is a diagram showing still another example of structure for explaining a method for estimating the grain size of a poly-silicon according to the present invention.
Figure 7A:
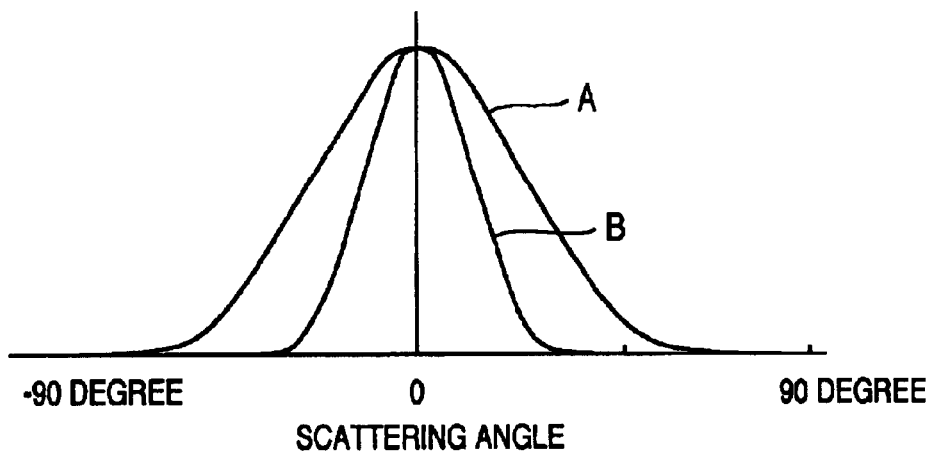
FIG. 7A and FIG. 7B are diagrams for explaining a principle of poly-silicon grain size estimation according to the present invention.
Figure 7B:
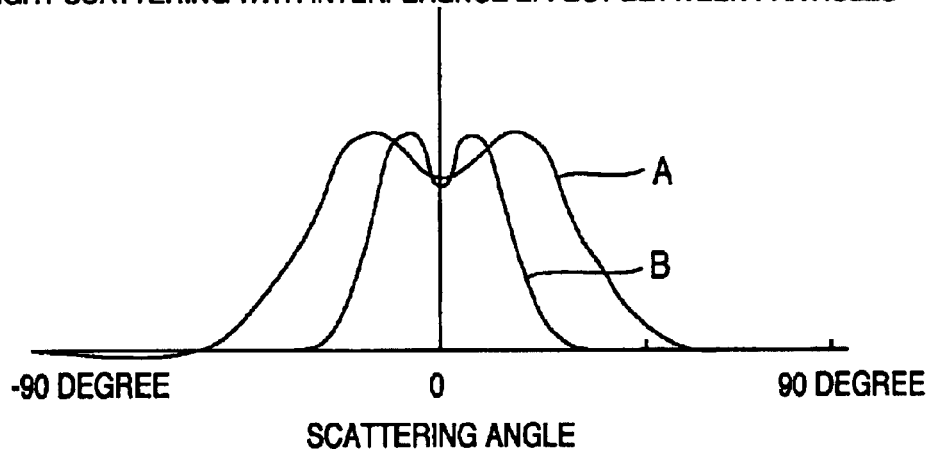
Figure 13:
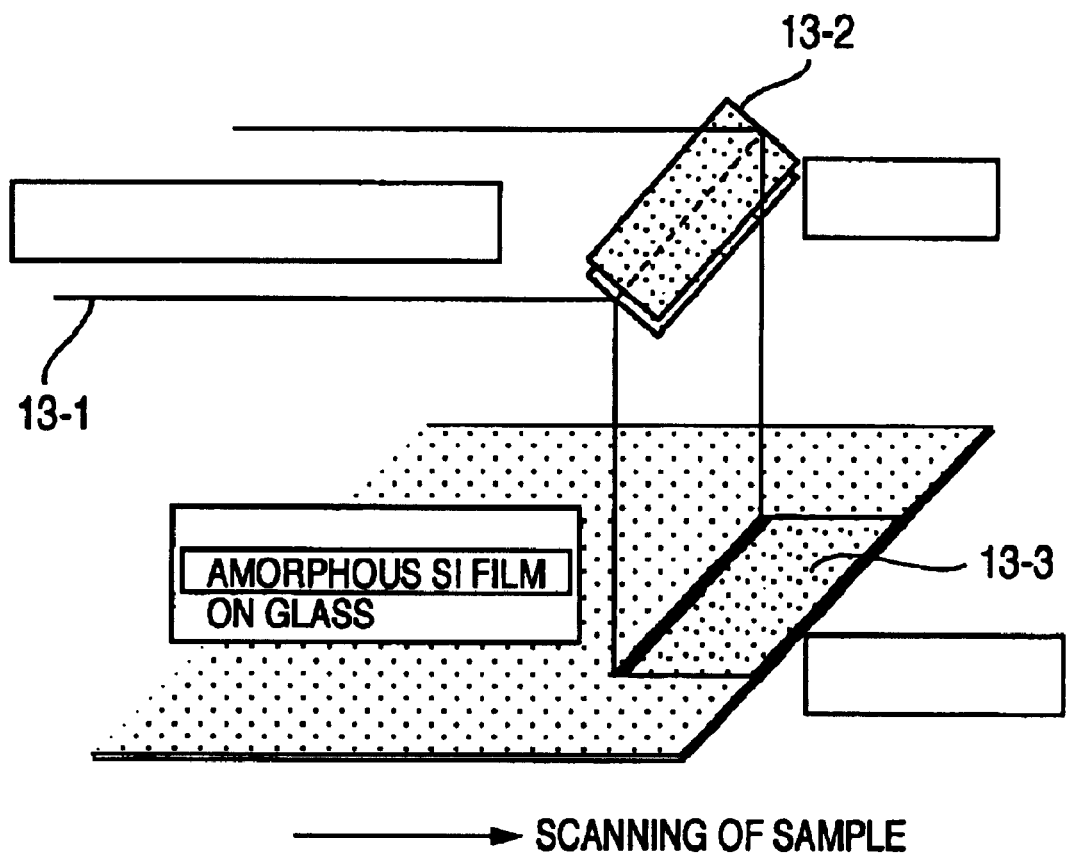
FIG. 13 is a diagram showing a polycrystal silicon formation process employing laser annealing.

FIG. 3 is a diagram showing a method for estimating the grain size of a poly-Si according to another embodiment of the present invention. That is, FIG. 13 shows a method comprising irradiating a sample 1 with laser beams perpendicularly from the side on which the poly-Si film of the sample 1 has been formed, and measuring a diffraction pattern in a direction in which backscattering is detected. FIG. 5 shows a method for measuring a light diffraction pattern in the case of oblique incidence of irradiation light. As an actual production process, a process for producing a liquid crystal display by the use of the method for estimating the grain size of a poly-Si according to the present embodiment can be practiced by carrying out an inspection without destruction and contact. Therefore, it is needless to incorporate a dummy sample into a production lot as before, and a product sampling inspection or a total inspection can be carried out. For this purpose, a light diffraction pattern has to be measured within 10 minutes per each sample, and hence there is adopted a method in which a plurality of positions of a substrate sample are subjected at the same time to measurement by scanning by using multiple irradiation laser beams for measurement as shown in FIGS. 2A and 2B. FIGS. 4A and 4B are diagrams showing the structure of a measurement system using multiple irradiation laser beams which is obtained by the use of the measurement system shown in FIG. 3. Employment of such a multiple-beam system reduces the measurement time. A total inspection is carried out by setting the inspection time at a time shorter than the laser annealing process time. In addition, by providing a laser annealing equipment with a function corresponding to the above-mentioned grain size estimation method as shown in FIG. 6, the grain size can be estimated without taking a substrate sample out of the equipment. In this case, there are a method in which the grain size of an annealed portion is estimated simultaneously with scanning of the substrate sample during annealing, and a method in which the grain size is estimated after completion of the annealing. As in a method using a separated estimation equipment, the quality of the substrate sample is judged on the basis of the estimation result. When the substrate sample is no good, whether re-annealing is conducted or not is judged. When re-annealing is conducted, conditions for it are determined. On the basis of the information thus obtained, laser re-annealing is carried out.

Figure 17:
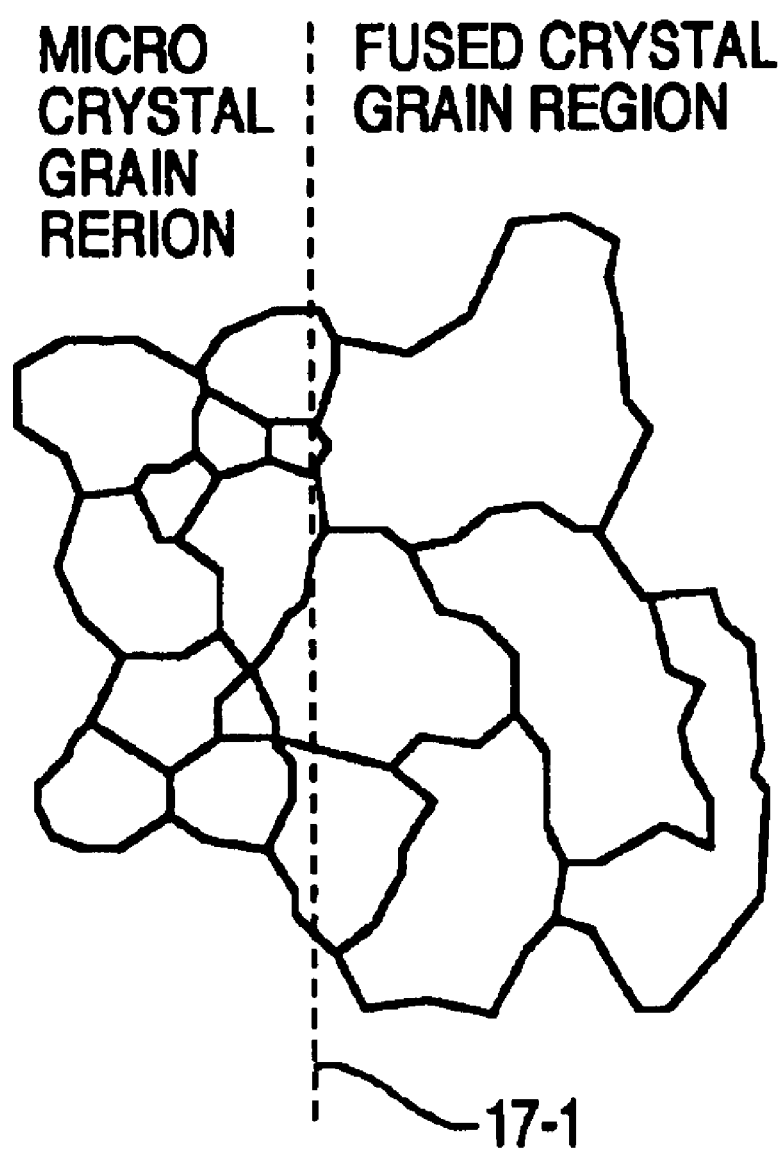
FIG. 17 shows the appearance of micro crystal steak lines in the case of a high-fluence region.
Figure 18:
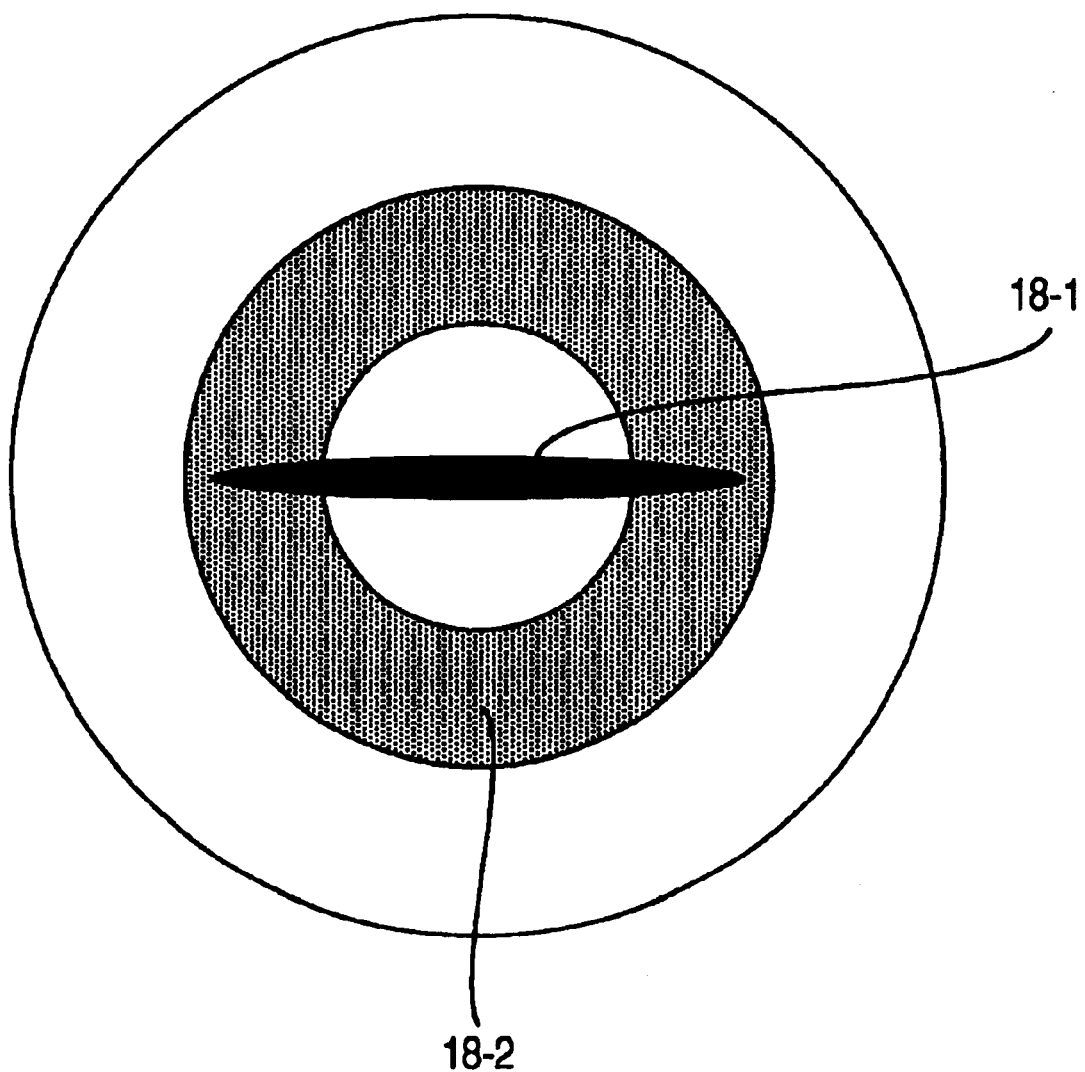
FIG. 18 is a schematic view of a light diffraction pattern in the case where micro crystal streak lines are present.

FIG. 17 shows the shape of micro crystals present together with other crystals in the case of the E region shown in FIG. 14. That is, an in-plane region where fused crystals with a grain size of 500 nm or more are present and an in-plane region where micro crystals with a grain size of 200 nm or less are present are dependent on the shape of an area irradiated with anneal laser beams, and the micro crystal grain region is formed so that a boundary between the fused crystals and the micro crystals is formed in parallel with the direction of long axis of the anneal laser beam. This is because the anneal laser beam is pulsed light and its fluence varies at intervals of one pulse. The micro crystal grain region having streak lines can be detected on the basis of the average grain size determined from the breadth of angular distribution in a light diffraction pattern. In addition, the streak lines are detected as a linear pattern in the light diffraction pattern. FIG. 18 schematically shows the light diffraction pattern containing the linear pattern due to the micro crystal streak lines. The linear pattern appears at a scattering angle range of approximately 5° to 10° and extends in the direction of short axis of the anneal laser beam. To detect the linear pattern, it is sufficient that by the use of the detector shown in the FIG. 11, the light diffraction pattern is measured in terms of a quantity proportional to the difference between the intensity of a signal from a detector unit set in the 0° direction and the intensity of a signal from a detector unit set in the 90° direction.

Figure 19:
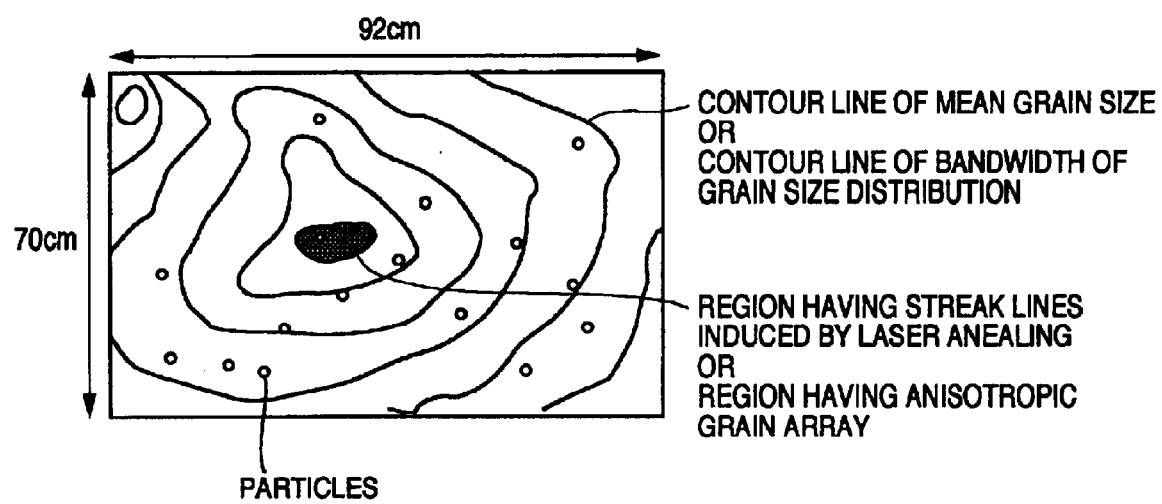
FIG. 19 shows an example of representation of an inspection result.

FIG. 19 shows an example of representation of an estimation result obtained by the present measurement method. That is, FIG. 19 shows the in-plane distribution of the grain size, the in-plane distribution of micro crystal appearance regions, and the in-plane distribution of foreign matters. The foreign matters are detected as portions where the intensity of scattered light is locally high.

In the present embodiment, there is described a process for producing a poly-Si film with a grain size in the D region shown in FIG. 14, though there may be adopted a process in which the production is controlled in a grain size region other than the D region. In this case, the lower limit and upper limit of an average grain size set as a production condition are fixed. When there is a grain size smaller than the lower limit, this information is fed back to the process so as to increase the fluence of anneal laser beams. When there is a grain size larger than the upper limit, this information is fed back to the process so as to reduce the fluence of anneal laser beams.

It will be further understood by those skilled in the art that the foregoing description has been made on embodiments of the invention and that various changes and modifications may be made in the invention without departing from the spirit of the invention and scope of the appended claims.

As described above in detail, according to the present invention, the following process for producing a polycrystal silicon film can be provided: by utilizing the fact that a diffraction pattern of a poly-Si film formed varies depending on the average grain size of the film, the grain size is estimated by measuring the angular distribution of scattered light intensities with a plurality of light detector units to evaluate an actual product of large substrate sample without contact and destruction, therefore the product nonuniformity is low and the yield is high owing to early removal of rejects. In particular, it becomes possible to control a poly-Si film with an average grain size larger than 300 nm, a grain size at which the surface roughness becomes maximal owing to a fluence change. Thus, it becomes possible to mass-produce a liquid crystal display comprising a poly-Si film having an average grain size of 500 nm or more and a range of the in-plane variation of the average grain size in a range of ±20%.

What is claimed is:

1. A process for producing a polycrystal silicon film which comprises a step of forming a polycrystal silicon film by light irradiation of a silicon film formed on a substrate with scanning the substrate; a step of measuring the grain size of said polycrystal silicon film by determining the poly-silicon grain size by measuring a diffraction pattern; and a step of adjusting the energy of said light irradiation on the basis of said grain size, wherein said determining the poly-silicon grain size by measuring said light diffraction pattern comprises irradiating the substrate sample with a light beam having a wavelength of less than 540 nm, measuring the angle dependency of scattered light intensity at least in an angle range of 5° to 40° from an axis of the irradiating light beam, and determining the grain size from the thus obtained information on the angular distribution.

2. The process of claim 1, wherein said scattered light is light scattered in a forward direction relative to said light beam having a wavelength of less than 540 nm.

3. The process of claim 1, wherein said scattered light is light scattered in a reverse direction relative to said light beam having a wavelength of less than 540 nm.

* * * * *